US006430731B1

(12) United States Patent
Lee et al.

(10) Patent No.: US 6,430,731 B1
(45) Date of Patent: Aug. 6, 2002

(54) METHODS AND APPARATUS FOR PERFORMING SLEW DEPENDENT SIGNAL BOUNDING FOR SIGNAL TIMING ANALYSIS

(75) Inventors: Jin-Fuw Lee, Yorktown Heights; Daniel Lawrence Ostapko, Mahopac; Jeffrey Paul Soreff, Poughkeepsie, all of NY (US); Chak-Kuen Wong, Shatin (HK)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/368,479

(22) Filed: Aug. 4, 1999

(51) Int. Cl.⁷ ............................................... G06F 17/50
(52) U.S. Cl. .................................... 716/6; 716/4; 716/5
(58) Field of Search ..................... 716/6, 5, 4

(56) References Cited

U.S. PATENT DOCUMENTS

| 5,508,937 | A | * | 4/1996 | Abato et al. | 716/6 |
| 5,535,145 | A | * | 7/1996 | Hathaway | 703/2 |
| 5,651,012 | A | * | 7/1997 | Jones et al. | 714/724 |
| 6,145,117 | A | * | 11/2000 | Eng | 716/18 |
| 6,301,693 | B1 | * | 10/2001 | Naylor et al. | 716/10 |

OTHER PUBLICATIONS

Venkatesh et al, "Timing Abstraction of Intellectual Property Blocks," IEEE, May 1997, pp. 99–102.*
Kayssi et al, "Analytical Transitient Response of CMOS Inverters," IEEE, Jan. 1992, pp. 42–45.*
Xiao et al, "Worst Delay Estimation in Crosstalk Aware Static Timing Analysis," IEEE, Sep. 2000, pp. 115–120.*
R.B. Hitchcock, Sr. et al., "Timing Analysis of Computer Hardware," IBM J. Res. Develop., vol. 26, No. 1, pp. 100–105, Jan. 1982.
J.K. Ousterhout, "A Switch–Level Timing Verifier for Digital MOS VLSI," IEEE Transactions on Computer–Aided Design, vol. CAD–4, No. 3, pp. 336–348, Jul. 1985.
N. Hedenstierna et al., "CMOS Circuit Speed and Buffer Optimization," IEEE Transactions on Computer–Aided Design, vol. CAD–6, No. 2, pp. 270–281, Mar. 1987.
K.A. Sakallah, et al., "check$T_c$ and min$T_c$: Timing Verification and Optimal Clocking of Synchronous Digital Circuits," Proc. ICCAD, pp. 552–555, Nov. 1990.
T.G. Szymanski et al., "Verifying Clock Schedules," Proc. ICCAD, pp. 124–131, Nov. 1992.
J–F Lee et al., "A Timing Analysis Algorithm for Circuits with Level–Sensitive Latches," IEEE Transactions on Computer–Aided Design of Integrated Circuits and Systems, vol. 15., No. 5, pp. 535–543, May 1996.

* cited by examiner

*Primary Examiner*—Vuthe Siek
(74) *Attorney, Agent, or Firm*—Ryan, Mason & Lewis, LLP; Paul J. Otterstedt

(57) ABSTRACT

Methods and apparatus for use in signal timing analysis with respect to a circuit having at least one gate are provided. In one aspect, the invention includes the step of determining a first constraint slew sensitivity value and a second constraint slew sensitivity value for the at least one gate according to a specified bounding technique. Then, a representative signal for the gate is computed in accordance with the first and second values including an arrival time and slew rate, wherein the representative signal bounds signal paths by bounding a maximum slew sensitivity path and a minimum slew sensitivity path. Such a representative signal may be computed for a worst case late-mode analysis and/or a best case early-mode analysis. The bounding technique may be selected by a user at the time the user inputs the schematic of the circuit on which timing analysis is to be performed. The invention provides for the use of bounding techniques such as, for example, maximum slew, minimum slew, half envelope, full envelope, modified half envelope, modified max slew, modified min slew, least upper bound, and greatest lower bound. The invention may preferably be employed in accordance with static timing analysis associated with VLSI circuit design.

43 Claims, 9 Drawing Sheets

$\Delta S = S_j - S_i > 0$ $\Delta S = S_j - S_i < 0$

OVERLAP IN LOWER HALF

OVERLAP IN UPPER HALF $w$ IS ALWAYS LATER THAN $w_i$ IN THE FAN-OUT CONE $w$ ARRIVES AT ALL PRIMARY OUTPUTS IN THE FAN-OUT CONE LATER THAN $w_i$

SIGNALS $i > j$

SIGNALS $j > i$

SIGNALS $i <> j$

SIGNALS $i <> j$

STATIC TIMER USING BOUNDING SIGNALS

US 6,430,731 B1

METHODS AND APPARATUS FOR PERFORMING SLEW DEPENDENT SIGNAL BOUNDING FOR SIGNAL TIMING ANALYSIS

FIELD OF THE INVENTION

The present invention relates generally to signal timing analysis techniques and, more particularly, to methods and apparatus for performing slew dependent signal bounding for use in signal timing analysis.

BACKGROUND OF THE INVENTION

The propagation of rise and fall times, i.e., slews, has been a long standing problem in static timing analysis, e.g., see J. K. Ousterhout, "A Switch-Level Timing Verifier for Digital MOS VLSI," in IEEE Trans. on CAD, vol. 3, July 1985, pp. 336–349, and N. Hedenstierna and K. O. Jeppson, "CMOS Circuit Speed and Buffer Optimization," IEEE Trans. on CAD, vol. 6, March 1987, pp. 270–281. Signals arriving at a given node of a circuit may be generated from different input patterns and may travel through different paths. In a static timing analysis, all of these signals are compared. One signal, namely, the latest signal, is selected to represent the worst-case arrival time bound, and kept to carry through the circuit network (a similar approach can be used for the earliest arriving or early-mode signal). The validity of this approach is based on the observation that the latest signals always yield the latest arrival times when they propagate to the primary output. The monotone nature of signal propagation time in this plain form is true, only if the slew variations among the signals are small.

Examples of conventional timing analysis approaches which rely on this observation include: R. B. Hitchcock, Sr., "Timing Verification and the Timing Analysis Program," 19th Design Automation Conference. June 1982, pp. 594–604; K. A. Sakallah, T. N. Mudge and O. A. Olukotun, "Check Tc and Min Tc: Timing Verification and Optimal Clocking of Synchronous Digital Circuits," in Proc. ICCAD, November 1990, pp.552–555; G. Szymanski and N. Shenoy, "Verify Clock Schedule," in Proc. ICCAD, November 1992, pp. 124–131; and J. F. Lee, D. T. Tang, and C. K. Wong, "Algorithm for Circuits with Level-Sensitive Latches," in IEEE Trans. on CAD, vol. 15, May 1996, pp.535–543.

However, in reality, circuit designers encounter signals with a wide range of slews. The delay through a CMOS gate depends on the signal slew present at its inputs. The typical approach to accommodate the slew is via the following heuristic method known as the "latest arriving method." The latest arriving method dictates that during propagation through each gate, always adopt the slew carried by the latest arriving signal. There are two potential pitfalls with this latest arriving method.

First, the worst-case arrival time bound calculated may be invalid when the latest arriving method is employed, since an earlier signal with a slow slew may eventually reach the primary output later. For example in FIG. 1, assume that the arrival time $(a_f)$ of the fast signal at the output of gate 1 is later than that $(a_s)$ of the slow signal. Let the delay through gate 2 be $d_f$ and $d_s$ respectively for the fast and slow signals. Since $d_f < d_s$, the situation $a_f + d_f < a_s + d_s$ may be reached. This means that the slow signal becomes the latest one at the output of gate 2, and therefore can not be ignored.

Second, the monotonic property of signal propagation may be violated when the latest arriving method is employed, so that the convergence of the worst-case timing bound is no longer guaranteed. Let us assume that in FIG. 1, the fast signal is only slightly later than the slow signal at the output of gate 1. So the fast signal is chosen to propagate through gate 2, and the worst-case arrival time calculated at the output of gate 2 is $a_f + d_f$. If the fast signal is sped up so that its arrival time at the output of gate 1 is $a_f < a_s$, then the slow signal is chosen to propagate, and the worst-case time at the output of gate 2 becomes $a_s + d_s$ which is greater than $a_f + d_f$. The monotonic property is thus violated.

Therefore, it would be desirable to have methods and apparatus which provide improved ways to define the worst-case signals for timing analysis purposes so as to, among other things, avoid the problems associated with the above-described conventional latest arriving method.

SUMMARY OF THE INVENTION

The present invention provides methods and apparatus which provide improved ways to define the worstcase signals for timing analysis purposes so as to, among other things, avoid the problems associated with the above-described conventional latest arriving method.

In one aspect of the invention, a method for use in signal timing analysis with respect to a circuit having at least one gate includes the step of determining a first constraint slew sensitivity value and a second constraint slew sensitivity value for the gate according to a specified bounding technique. Then, a representative signal for the gate is computed in accordance with the first and second values including an arrival time and slew rate, wherein the representative signal bounds signal paths by bounding a maximum slew. sensitivity path and a minimum slew sensitivity path. Such a representative signal may be computed for a worst case late-mode analysis and/or a best case early-mode analysis.

The bounding technique may be selected by a user at the time the user inputs the schematic of the circuit on which timing analysis is to be performed. The invention provides for the use of bounding techniques such as, for example, maximum slew, minimum slew, half envelope, full envelope, modified half envelope, modified max slew, modified min slew, least upper bound, and greatest lower bound. The invention may be employed in accordance with static timing analysis associated with VLSI circuit design, however, one of ordinary skill in the art will appreciate various other applications such as, for example, circuit tuning given the inventive teachings herein. The invention may also be implemented in the form of a static timer apparatus.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
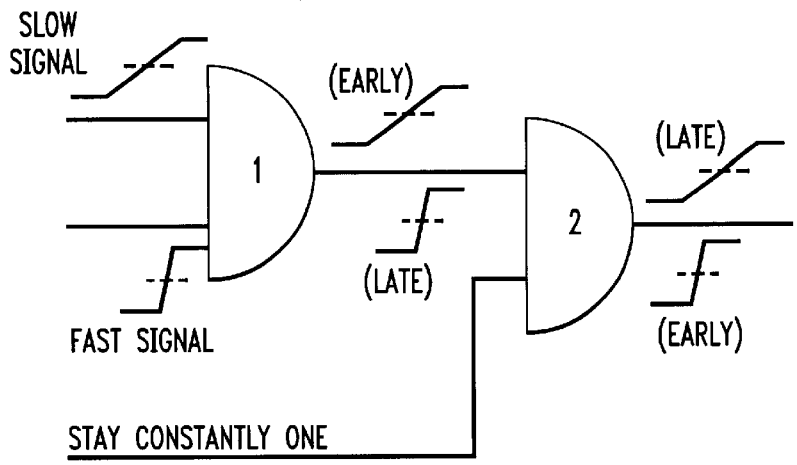
FIG. 1 is a diagram illustrating the conventional latest arriving method used to determine the worst-case arrival time bound.

The present invention is described below in the context of static timing analysis in VLSI (Very Large Scale Integration) circuit design. However, it is to be understood that the present invention is not limited to VLSI circuit design. Rather, the invention is more generally applicable to circuit design in which it is desirable to calculate a worst-case arrival time bound that is valid and for which the monotonic property of signal propagation is not violated.

It is to be appreciated that the term "processor" as used herein is intended to include any processing device, such as, for example, one that includes a CPU (central processing unit). The term "memory" as used herein is intended to include memory associated with a processor or CPU, such as, for example, RAM, ROM, a fixed memory device (e.g., hard drive), a removable memory device (e.g., diskette), etc. In addition, the term "input/output devices" or "I/O devices" as used herein is intended to include, for example, one or more input devices, e.g., keyboard, for inputting data to the processing unit, and/or one or more output devices, e.g., CRT display and/or printer, for providing results associated with the processing unit. It is also to be understood that various elements associated with a processor may be shared by other processors. Accordingly, software components including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU.

For ease of reference, the remainder of detailed description will be divided into sections as follows: (I) Characteristics of Slew Dependence; (II) Constructing Bounding Signals for Positive $\alpha_m$; (III) Generating Constraints for Bounding Signals; (IV) Multiple Signal Technique; (V) Static Timer Implementation; (VI) Experimental Results; and (VII) Early-mode Signals.

I. Characteristics of Slew Dependence

A VLSI circuit consists of primary inputs (PIs) and outputs (POs), gates, and a network of interconnects. It may be represented by a directed graph G. Nodes of G represent PIs, POs, and pins of gates, while edges of G represent either internal paths from input to output of a gate, or external routing paths between gates. The direction of an edge is defined in such a way that signals flow from its source node to its sink node. The directed graph G may have loops. Each loop must contain some latches or flip-flops, since a loop path consisting of combinational gates will produce a race condition and is not allowed. To perform a static timing analysis on G, worst-case signal arrival times are given at primary input nodes. No input pattern is specified. Under such circumstances, the goal of a static timer is to generate the worst-case arrival time at primary output nodes.

Signal waveforms traveling on a VLSI chip may be approximated by the ramp function, characterized by four parameters: the voltage levels before and after the transitions, arrival time at the midpoint of the ramp (a), and the duration of the ramp, or slew (s). For digital circuits, the voltage level is either 0 or VDD, and the ramp may represent either a rising or falling transition. For a general signal waveform, the arrival time is defined as the time the signal voltage crosses 0.5 VDD, while the slew is defined as 1.25 times the duration the signal voltage swings between 0.1 VDD and 0.9 VDD. When there is no confusion, the signal waveform defined by w=(s, a) will be called signal as abbreviation for signal waveform.

For the delay propagation through gates, a static timer may either evaluate the delay on the fly with a fast simulator or calculate the delay with some analytical delay rules. For each input pin to output pin path inside gate i, the signal arrival time and slew at the output pin are functions of the signal arrival time, slew at the input pin and other circuit parameters such as capacitance loading. Consider an internal path from input pin j to the output pin i. Let the arrival time and slew at the input pin be $a_j$ and $s_j$, respectively. The arrival time and the slew at the output pin are respectively $a_{ji}$ and $s_{ji}$ such that:

$$a_{ji} = a_j + f_{ji}(s_j) \quad (1)$$

$$s_{ji} = g_{ji}(s_j) \quad (2)$$

where $f_{ji}$ and $g_{ji}$ represent, respectively, the delay and slew propagation rule for a path from pin j to pin i. These delay rules, defined in equations (1) and (2), may vary from a simple unit delay model, a linear delay model, to a piecewise quadratic delay model with coefficients extracted from curve-fitting of many simulation runs. The dependence on other circuit parameters was dropped for clarity, as it is irrelevant to an understanding of the present invention.

According to the invention, we now provide the following definition. For a function $f(s)$ of slew, the average and instantaneous slew sensitivity are defined as $\Delta f/\Delta s$ and $df/ds$. The maximum and minimum sensitivity are respectively defined as $$D_M f = \max_s df/ds, \text{ and } D_m f = \min_s df/ds.$$

Both $f_{ji}$ and $g_{ji}$ are weak functions of slew. By the mean-value theorem of calculus, for any slew interval, there exists a point with the instantaneous sensitivity equal to the average slew sensitivity. Hence, the average slew sensitivities are bounded in the same way as the instantaneous sensitivity:

$$\alpha_{mi} \leq \Delta f_{ji}/\Delta s \leq \alpha_{Mi} \text{ where } \alpha_{mi} = D_m f_{ji} \text{ and } \alpha_{Mi} = D_M f_{ji} \quad (3)$$

$$\beta_{mi} \leq \Delta g_{ji}/\Delta s \leq \beta_{Mi} \text{ where } \beta_{mi} = D_m g_{ji} \text{ and } \beta_{Mi} = D_M g_{ji} \quad (4)$$

From detailed spice simulation for static CMOS gates under different slew (e.g., from 50 ps [pico seconds] to 400 ps) and load conditions (e.g., from 25 ff [fento farads] to 150 ff), the range of slew sensitivities are compiled below in Table 1:

TABLE 1

| Ckt/sensitivity | $\Delta f/\Delta s$ | $\Delta g/\Delta s$ |
|---|---|---|
| NAND2 | 0.04–0.20 | 0.29–0.36 |
| NOR2 | 0.05–0.16 | 0.27–0.35 |
| NAND3 | 0.01–0.22 | 0.20–0.35 |
| NOR3 | 0.03–0.20 | 0.20–0.36 |
| AOI22 | 0.06–0.20 | 0.18–0.37 |
| OAI22 | 0.06–0.20 | 0.18–0.37 |

The maximum sensitivities across the CMOS gate library in Table 1 are $\alpha_M=\max\{\alpha_{Mi}\}=0.25$ and $\beta_M=\max\{\beta_{Mi}\}=0.4$. The positive minimum sensitivities, $\alpha_m=\min\{\alpha_{mi}\}$ and $\beta_m=\min\{\beta_{mi}\}$, from Table 1 imply that both $f_{ji}$ and $g_{ji}$ are monotonic increasing functions of slew. In the rare case that a slow signal is used to drive a low-threshold dynamic circuit, $\alpha_m$ may become negative, and using the 50% to 50% delay, a slew increase might actually speed up the circuit. Regarding $\beta$'s, we shall make the following assumption:

$$0<\beta_{mi}, \beta_{Mi}<1 \qquad (5)$$

Figure 2A:
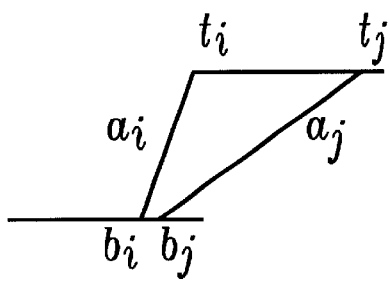
FIGS. 2A through 2D are diagrams illustrating two signals in several different arrival sequences.
Figure 2B:
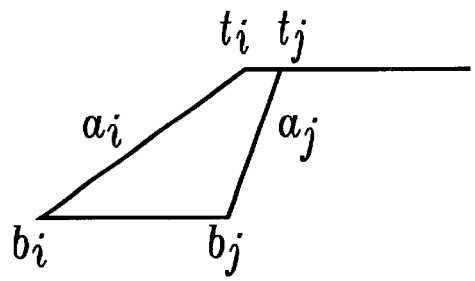

There are some theoretical bounds to $\alpha$'s and $\beta$'s. Assume that two signals, $w_i$ and $w_j$, are present at the same input pin of a gate. Let $w'_i$ and $w'_j$ be the corresponding signals at the output pin of the gate. In the following, we shall use b, a, t to denote the 0%, 50% and 100% times of a signal. If $w_i$ and $w_j$ are non-overlapping in the order $a_i<a_j$ as shown in FIGS. 2A and 2B, according to the principle of causality, we expect that $w'_i$ and $w'_j$ are still non-overlapping in the same order $a'_i<a'_j$. Mathematically, the condition for non-overlapping signals $w_i$ and $w_j$ is $\Delta b=b_j-b_i\geq 0$ and $\Delta t=t_j-t_i\geq 0$. In terms of $\Delta a=a_j-a_i$ and $\Delta s=s_j-s_i$, these two relations give $\Delta(a-s/2)\geq 0$ and $\Delta(a+s/2)\geq 0$, or $\Delta a\geq|\Delta s/2|$ in short. Then, the causality condition can be stated as follows: If $\Delta a\geq|\Delta s/2|$, then $\Delta a'\geq|\Delta s'|/2$. From the gate delay rules, $\Delta a'=\Delta a+\Delta f$ and $\Delta s'=\Delta g$ where $\Delta f=f(s_j)-f(s_i)$ and $\Delta g=g(s_j)-g(s_i)$. The sufficient condition for $\Delta a'\geq|\Delta s'|/2|$ can be rewritten as:

$$2(\Delta a+\Delta f)\geq|\Delta g|. \qquad (6)$$

For the case $\Delta s=s_j-s_i>0$ as shown in FIG. 2A, divide equation (6) with $\Delta s$ and we have $2\Delta a/\Delta s+2\Delta f/\Delta s\geq|\Delta g|/\Delta s$. This inequality is true, if the minimum of the left hand side is not smaller than the maximum of the right hand side. The minimum of $\Delta a/|\Delta s|$ for non-overlapping signals is ½. The minimum of $\Delta f/\Delta s$ is $\alpha_m$, while the maximum of the right hand side is $\beta_M$. This means that:

$$1+2\alpha_m\geq\beta_M \qquad (7)$$

For the case $\Delta s<0$ as shown in FIG. 2B, divide equation (6) with $-\Delta s$ (a positive number) and we have $2\Delta a/|\Delta s|\geq 2\Delta f/\Delta s+|\Delta g/\Delta s|$. This inequality is true, if the minimum of the left hand side is not smaller than the maximum of the right hand side. The minimum of $\Delta a/|\Delta s|$ for non-overlapping signals is ½. The maximum of $\Delta f/\Delta s$ is $\alpha_M$, while the maximum of $|\Delta g/\Delta s|$ is $\beta_M$. This means that:

$$1\geq 2\alpha_M+\beta_M \qquad (8)$$

The maximum value for $\alpha_M$ that satisfies equations (5) and (8) is 0.5, while the minimum value for $\alpha_m$ that satisfies equations (5) and (7) is −0.5. Equations (5), (7) and (8) on bounds of $\alpha$'s and $\beta$'s hold for the sensitivity in Table 1. We assume herein that this is the case. We shall also assume herein that the wiring delay is either negligible, or can be modeled also by equations (5) to (8).

II. Constructing Bounding Signals for Positive $\alpha_m$

Now let us consider the typical case with positive $\alpha_m$. In this case, both $f_{ji}$ and $g_{ji}$ are monotonic increasing functions of slew. In other words, a larger slew at the input produces a longer gate delay, and a larger slew at the output. In the following, we shall use this property to construct a representative signal, when a set of signals, $W=\{w_1, w_2 \ldots w_n\}$, are present at the same gate input.

Figure 2C:
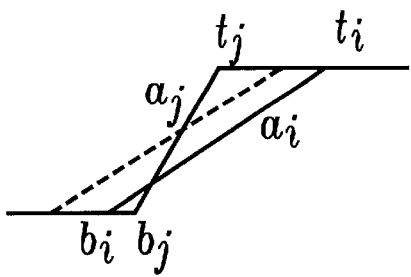
Figure 2D:
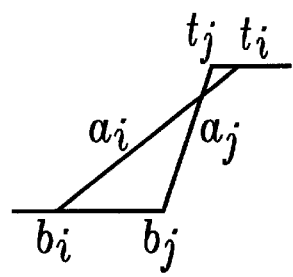

First let us work with only two signals, $w_i$ (slow rise time) and $w_j$ (fast rise time). If two signals are non-overlapping, then one signal is always earlier than the other signal, and can be discarded by the principle of causality. Therefore, we need only to consider the overlapping case. If two signals overlap in the lower half voltage interval [0, VDD/2] including VDD/2 as shown in FIG. 2C, we can construct a signal $w=(s_j, a_i)$ shown as a dashed line. Then, because of a smaller gate delay, after passing one gate, $w_j$ will become earlier than w which is earlier than $w_i$ by the amount $a_i-a_j$. So $w_j$ can be discarded in this case. We are left with the case that two signals overlap in the upper half voltage interval [VDD/2, VDD] as shown in FIG. 2D. In this case, there are several better bounding methods other than the frequently used latest arriving method, e.g., maximum slew method, full envelope method, and half envelope method. These methods require the construction of a representative signal, which can bound both signals.

Figure 3:
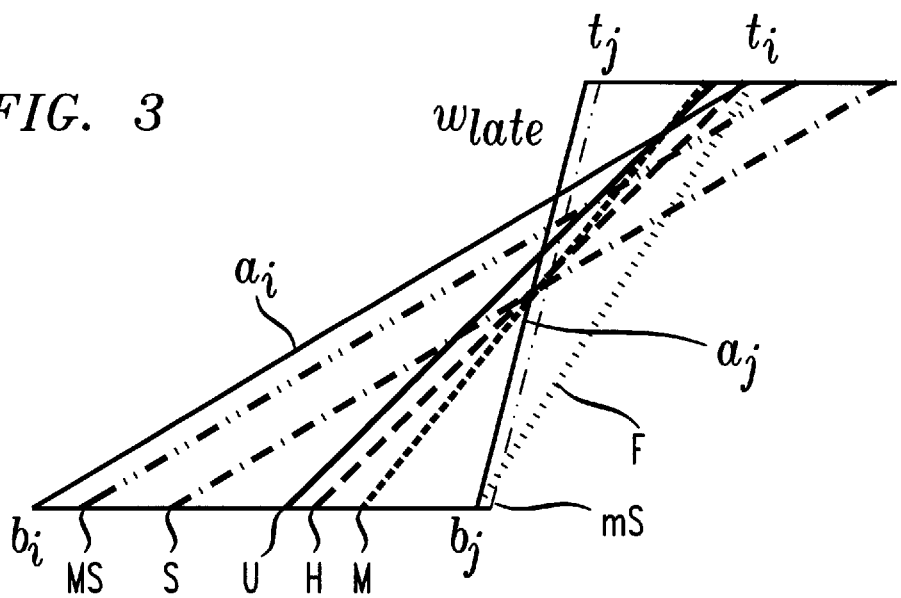
FIG. 3 is a diagram illustrating several signal bounding methods.

Referring now to FIG. 3, examples of such signal bounding methods are shown along with the late arriving method. The latest arriving method dictates picking the signal $w_{late}=(s_{late}, a_{late})$ with the maximum arrival time. For an example, see the solid line between $b_j$ and $t_j$ in FIG. 3. In the maximum slew method, a signal, $w_{slew}=(s_{slew}, a_{slew})$, is constructed with the maximum slew and arrival time. For an example, see the dashed-dot line marked "S" in FIG. 3. In the full envelope method, a signal, $w_{full}=(s_{full}, a_{full})$ is constructed which covers all the signals from the right hand side. For an example, see the dotted line marked "F" in FIG. 3. In the half envelope method, a signal, $w_{half}=(s_{half}, a_{half}$, is constructed which covers all the signals in the upper half voltage range [VDD/2, VDD] from the right hand side. For an example, see the long dash line marked "H" in FIG. 3.

For the general case with more than two signals in W, where $W=\{w_1, W_2, \ldots, w_i, \ldots\}$, the representative signals are:

$$a_{late} = \max_i a_i. \qquad (9)$$

$$a_{slew} = \max_i a_i, s_{slew} = \max_i s_i.$$

$$a_{full} = \left(\max_i b_i + \max_i t_i\right)/2, s_{full} = \max_i t_i - \max_i b_i.$$

$$a_{half} = \max_i a_i, s_{half} = 2\left(\max_i t_i - \max_i a_i\right).$$

In the maximum slew, full envelope and half envelope methods, some new signals, $w_{slew}$, $w_{full}$ and $w_{half}$, which are worse than any signal in W, are constructed. Therefore, the propagation of these signals will always yield valid upper bounds to the worst-case timing result, while the latest arriving method may lead to an invalid answer. Since only the upper half voltage range is relevant in this positive $\alpha_m$ case, $w_{half}$ is the tightest upper bound among the three.

Next we investigate the accuracy penalty paid when we replace a set of signals with a single signal. Again, we shall use the two signal examples in FIG. 2D. At a gate input, we have two non-overlapping signals, $w_i$ and $w_j$, with $s_i > s_j$. Let $w'_i$ and $w'_j$ be the corresponding signals at the gate output. Let $a = \max(a_i, a_j)$ and $\Delta a = a_i - a_j$. Then the true worst-case arrival time at the gate output is $a' = \max(a'_i, a'_j)$. For comparison, $a'$ and the arrival times at output for $w_{half}$, $w_{slew}$, and $w_{full}$ are plotted in FIG. 4 as functions of $\Delta a$ for fixed $a$. Without loss of generality, $a$ is set to 0. A detailed derivation of these arrival times is given below (with $\Delta s = s_i - s_j$ and $\Delta d = d(s_i) - d(s_j)$).

Figure 4:
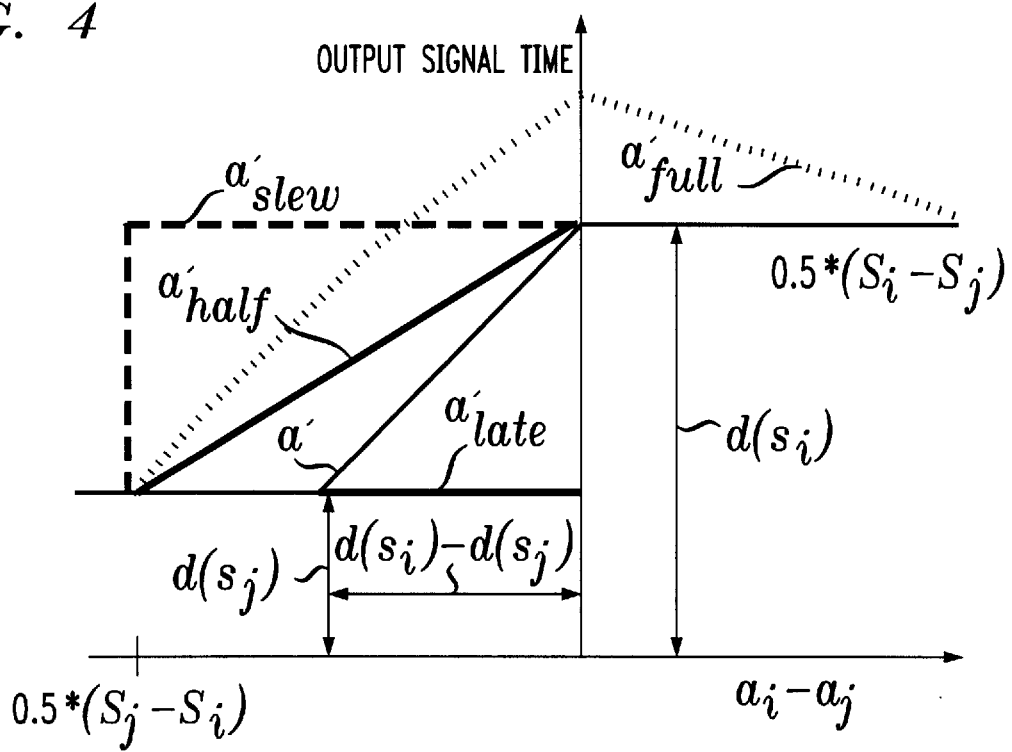
FIG. 4 is a diagram illustrating arrival times at gate outputs as a function of $\Delta a$ for the several bounding methods.

Referring now to FIG. 4, the four methods are graphically illustrated with respect to output signal time (i.e., the arrival time at gate output) as functions of $a_i - a_j$. First, the dependence of $a'$ on $\Delta a$ is computed and shown as the piece-wise linear solid line in FIG. 4. There are three regions. For $\Delta a \geq 0$, the slow signal dominates ($w_j \leq w_i$), and $a' = a'_i = d(s_i)$. For $\Delta a \leq -\Delta d$, $a'_i < a'_j$ and the fast signal dominates: $a' = a'_j = d(s_j)$. For $0 > \Delta a > -\Delta d$, $a'_i > a'_j$ (i.e., the earlier slow signal has a later arrival time at the output) and $a' = a'_i = a_i + d(s_i) = \Delta a + d(s_i)$.

Next, let we compute the dependence of $a'_{late}$ on $\Delta a$ as shown in FIG. 4. For $\Delta a \leq 0$, the fast signal dominates, and $a'_{late} = a'_j = d(s_j)$. For $\Delta a \geq 0$, the slow signal dominates, and $a'_{slew} = a'_i = d(s_i)$. The maximum error in $a'_{slew}$ occurs when $\Delta a$ is slightly negative, that is, $\text{Error}_{late} = -(d(s_i) - d(s_j))$.

Next, we compute the dependence of $a'_{slew}$ on $\Delta a$ shown as dashed lines in FIG. 4. There are two regions. For the region of $\Delta a \leq -\Delta s/2$, the fast signal dominates: $a'_{slew} = d(s_j)$. For the region of $\Delta a > -\Delta s/2$, two signals become overlapping, and the slew from the slow signal is selected: $a'_{slew} = d(s_i)$. The maximum error in $a'_{slew}$ occurs in the region $-\Delta s/2 \leq \Delta a \leq -\Delta d$, that is $\text{Error}_{slew} = d(s_i) - d(s_j)$.

Next, we compute the dependence of $a'_{full}$ on $\Delta a$ shown as dotted lines in FIG. 4. For $\Delta a \leq -\Delta s/2$, the fast signal dominates: $a'_{full} = d(s_j)$. For $\Delta a \geq \Delta s/2$, the slow signal dominates: $a'_{full} = d(s_i)$. For the intermediate region ($\Delta s/2 > \Delta a > -\Delta s/2$), $a_{full} = (t_i + b_j)/2 = a_j + (t_i - t_j)/2$, $s_{full} = t_i - b_j = s_i + (t_i - t_j)$, and $a'_{full} = a_{full} + d(s_{full}) = a_j + (t_i - t_j)/2 + (d(s_j) + \alpha^*(t_i - t_j)) = a_j + (\frac{1}{2} + \alpha)^*(t_i - t_j) + d(s_j) = a_j + (\frac{1}{2}\alpha)^*(\Delta a + \Delta s/2) + d(s_j)$. The maximum error in $a'_{full}$ occurs at $\Delta a = -\Delta d$, that is, $\text{Error}_{full} = a'_{full} - d(s_j) = (\frac{1}{2} + \alpha)^*(-\Delta d + \Delta s/2) = ((1 - 4\alpha^2)/4\alpha)(d(s_i) - d(s_j))$.

Next, we compute the dependence of $a'_{half}$ on $\Delta a$ shown as heavy solid lines in FIG. 4. There are three regions. For the left region ($\Delta a \leq -\Delta s/2$), the fast signal dominates: $a'_{half} = d(s_j)$. For the right region ($\Delta a \geq 0$), the slow signal dominates: $a'_{half} = d(s_i)$. For the middle region ($0 > \Delta a > -\Delta s/2$), $s_{half} = 2(t_i - a_j) = s_i + 2\Delta a$ and $a'_{half} = a_j + d(s_{half}) = d(s_i + 2\Delta a) \approx d(s_i) + 2\alpha^* \Delta a$. The maximum error in $a'_{half}$ occurs when $\Delta a = -\Delta d$, that is $\text{Error}_{half} \approx d(s_i) + 2\alpha^* \Delta a - d(s_j) = (1 - 2\Delta)^*(d(s_i) - d(s_j))$.

From these error formulas, we obtain the following ratios:

$\text{Error}_{half}/\text{Error}_{late} = -(1 - 2\alpha)$, $\text{Error}_{half}/\text{Error}_{slew} = 1 - 2\alpha$, $\text{Error}_{half}/\text{Error}_{full} = 4\alpha/(1 + 2\alpha)$, For $\alpha = 0.25$ and $\beta = 0.4$, $-0.5^*\text{Error}_{late} = \text{Error}_{half} = 0.5^*\text{Error}_{slew} = 0.67^* \text{Error}_{full}$. Therefore, the worst-case error in the half envelope method is much smaller than the other methods.

III. Generating Constraints for Bounding Signals

The maximum slew, full envelope and half envelope methods described in the previous section require that both the 100% and 50% times be bounded during the propagation through the fan-out paths. The criterion for the bounding signal may be relaxed as follows. Suppose that two signals, $w_i = (s_i, a_i)$ and $w_j = (s_j, a_j)$, are present at the same gate input pin. When they propagate through fan-out paths to the latches, if one signal, say $w_i$, arrives at all the catching latches in the fan-out cone always later than the 50% time, $w_i$ will impose stronger timing constraint against the clock edges and shall be considered as the worst-case signal. With this new criterion, we do not require that either 50% or 100% times be bounded in the intermediate stages. It is to be appreciated that the fan-out cone of a gate i is defined as the set of all gates which can be reached from gate i through a sequence of combinational logic gates. In general, the set is a tree rooted at gate i.

Thus, we provide the following definition. For a pair of signals, $w_i = (s_i, a_i)$ and $w_j = (s_j, a_j)$, at the output pin of gate k, let $a_{in}$ and $a_{jn}$ be the 50% arrival time at latch n on the fan-out cone. Then, we define $w_i \leq w_j$ by the criterion that $a_{in} \leq a_{jn}$ for every latch n on the fan-out cone of gate k. Thus, we say that $w_i$ is dominated by $w_j$, or $w_j$ dominates $w_i$.

Figure 5A:
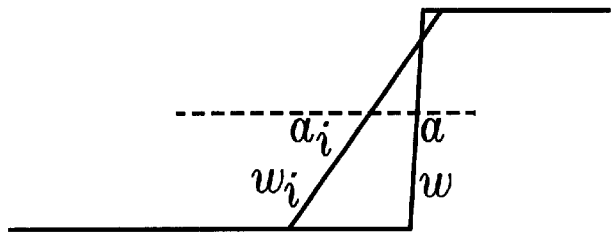
FIGS. 5A and 5B are diagrams of two exemplary cases illustrating dominance according to slew dependent signal bounding techniques of the invention.
Figure 5B:
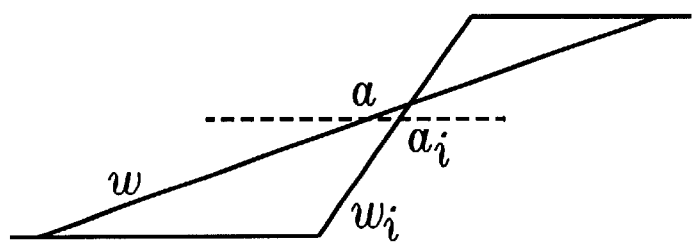

FIGS. 5A and 5B respectively illustrate two cases where $w$ dominates $w_i$. To explore the sufficient conditions for $w_i \leq w$, consider two extreme situations. In the case shown in FIG. 5A, a faster signal $w$ is initially later ($a \geq a_i$ and $s \leq s_i$), and the excess delay gain by $w_i$ over $w$ through the fan-out propagation is still small enough that the arrival time of $w$ is always later. In the case shown in FIG. 5B, a slower signal $w$ is initially slightly earlier ($a \leq a_i$ and $s \geq s_i$), but picks up enough delay gain over $w_i$ during the propagation and eventually appears at latches with later arrival times.

Let us examine more closely the new criterion for a dominating signal. First, a path, which consists of multiple stages of gates, can be regarded as one composite delay element with its own delay rules. The cumulative path delay and the slew of the output signal at the end of path p are functions of the input signal slew s:

$$d_p = f_p(s) \text{ and } s_p = g_p(s) \qquad (10)$$

Let the maximum and minimum slew sensitivity of $f_p(g_p)$ be $\alpha_{mp}(\beta_{mp})$ and $\alpha_{Mp}(\beta_{Mp})$. In subsection III(a) below, we describe a method to compute these bounds. Assume that a signal $w = (s, a)$ and another signal $w_i = (s_i, a_i)$ propagate from the same gate k through a fan-out path p to a capturing latch n. Then the difference in path delays, $d_p - d_{ip}$, of two signals are bounded:

$$\alpha_{mp} \leq (d_p - d_{ip})/(s - s_i) \leq \alpha_{Mp} \text{ where } \alpha_{mp} = D_m f_p \text{ and and } \alpha_{Mp} = D_M f_p \qquad (11)$$

Let the arrival times of two signals at latch n be $a_n$ and $a_{in}$. Since $d_p - d_{ip} = (a_n - a) - (a_{in} - a_i) = (a_n - a_{in}) - (a - a_i)$, this leads to:

$$(a - a_i)/(s - s_i) + \alpha_{mp} \leq (a_n - a_{in})/(s - s_i) \leq (a - a_i)/(s - s_i) + \alpha_{Mp}. \qquad (12)$$

For the smaller slew case $s_i \geq s$ in FIG. 5A, a sufficient condition to assure $(a_n - a_{in})/(s - s_i) \leq 0$ and hence $a_{in} \leq a_n$ is that the upper bound on the right-hand side of equation (12) is negative or zero. This condition, which is equivalent to $-(a - a_i)/(s - s_i) \geq \alpha_{Mp}$, must hold for every fan-out path from gate k to latches. Therefore:

$$-(a - a_i)/(s - s_i) \geq r_M \text{ or } a + r_M^* s \geq a_i + r_M^* s_i \qquad (13)$$

$$r_M = \max_p \alpha_{Mp},$$

where p is any path from gate k to a latch

Consider the path with maximum slew sensitivity: $\alpha_{Mp} = r_M$. Equation (13) implies that the signal with larger $a + r_M^*s$ will reach the end of the path with a later arrival time $a_n$, and hence $a_n$ is a monotonic increasing function of $a + r_M^*s$. We call $y = a + r_M^*s$ the max-path time of $w$.

For the larger slew case $s_i \leq s$ in FIG. 5B, a sufficient condition to assure $(a_n-a_{in})/(s-s_i) \geq 0$ and hence $a_{in} \leq a_n$ is that the lower bound on the left hand side of equation (12) is positive or zero. This condition, which is equivalent to $-(a-a_i)/(s-s_i) \leq \alpha_{mp}$, must hold for every fan-out path from gate k to latches. Therefore:

$$-(a - a_i)/(s - s_i) \leq r_m \text{ or } a + r_m * s \geq a_i + r_m * s_i \quad (14)$$

$$\text{where } r_m = \min_{\text{fan-out-paths}} \alpha_{mp}.$$

Consider the path with minimum slew sensitivity: $\alpha_{mp}=r_m$. Equation (14) implies that the signal with larger $a+r_m*s$ will reach the end of this path with a later arrival time $a_n$, and hence $a_n$ is a monotonic increasing function of $a+r_m*s$. We call $x=a+r_m*s$ the min-path time of w.

Figure 6:
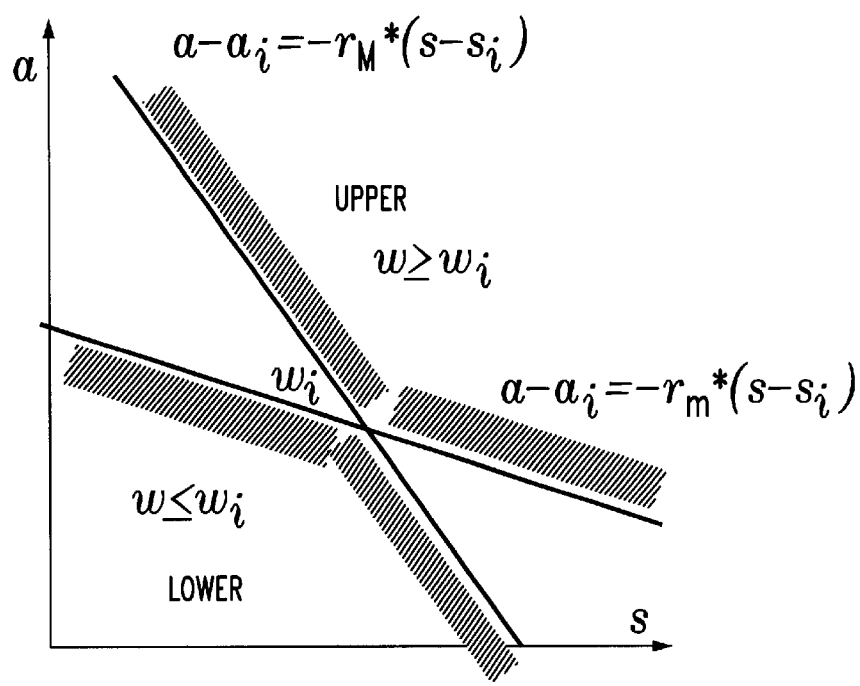
FIG. 6 is a diagram illustrating the quadrants in the s-a plane which contain lower and upper bounds on a signal.

Clearly $r_M \geq r_m$. Signal w dominates $w_i$, if both equations (13) and (14), are satisfied. Hereafter, equations (13) and (14) are respectively called max and min constraint, equations on $w_i$, and $r_M$ and $r_m$ as the slew sensitivity of max and min constraints. These constraint equations define a feasible region for $w_i \leq w$, which is marked as the upper quadrant in FIG. 6. Extension of the two lines representing constraint equations divides the s-a plane into four quadrants as shown in FIG. 6. For signal w in the upper quadrant, $w_i \leq w$. For signal w in the lower quadrant of FIG. 6, $w_i$ is in the region bounded by the constraint equations on w and hence $w \leq w_i$. In either case, we say that two signals are comparable. Signals outside these two quadrants are non-comparable.

We now consider bound regions of two or more signals. Let us first consider the bounding problem of two signals. Assume that there are two signals, $w_i$ and $w_j$, at the same output pin of a gate. Let $r_m$ and $r_M$ be the slew sensitivity of the corresponding min and max constraints. We would like to construct an upper-bound signal $w=(s, a)$ and find the condition that w dominates both $w_i$ and $w_j$. Also among the upper-bound signals, we would like to find the least upper-bound signal, which is a good candidate for use in the late-mode worst-case timing analysis.

Figure 7A:
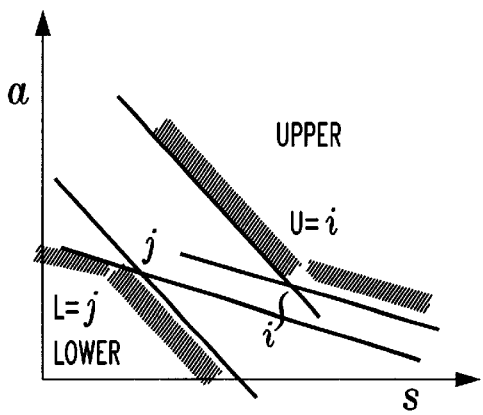
FIGS. 7A through 7D are diagrams illustrating upper and lower bounds for two signals according to slew dependent signal bounding techniques of the invention.
Figure 7B:
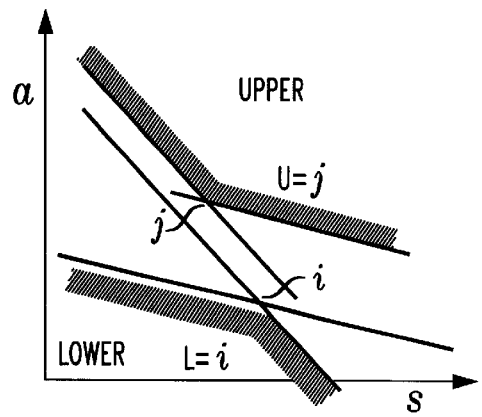
Figure 7C:
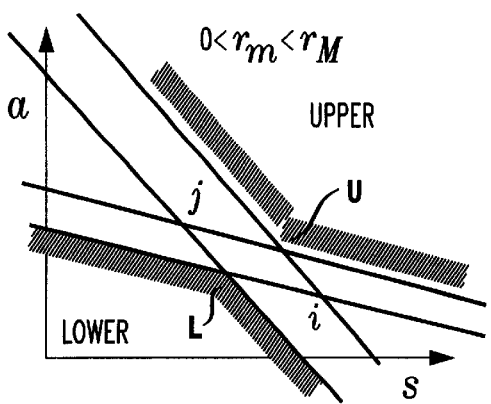
Figure 7D:
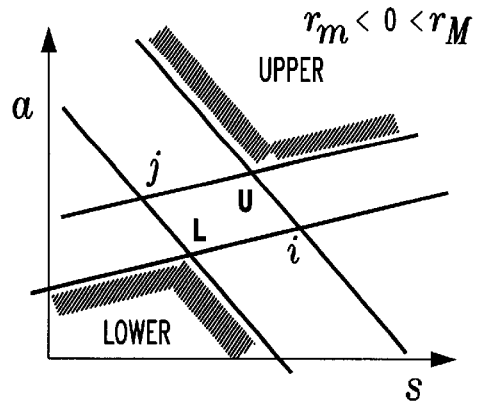

According to the definition of dominance in the invention, w must satisfy the max and min constraints for both $w_i$ and $w_j$, and thus fall into the intersection of upper quadrants of $w_i$ and $w_j$. If two signals are comparable, the intersection is equal to the upper quadrant from the dominant signal. Any signal in this quadrant will dominate both signals. The dominant signal, which also resides in this quadrant, is the least upper bounding signal. In FIG. 7B, the fast signal $w_j$ is the dominant signal and w must fall into the upper quadrant of $w_j$. In FIG. 7A, the slow signal $w_i$ is the dominant signal and w must fall into the upper quadrant of $w_i$. For the non-comparable case in FIG. 7C, the intersection of two upper quadrants can be obtained as follows. First, take the min constraint equation on $w_j$ and the max constraint equation on $w_i$. Then, find the intersection, U, of the two lines. Any signal in the upper quadrant of U will dominate both $w_i$ and $w_j$, and U is the least upper-bound signal. In the case that $r_m<0$ due to the negative sensitivity, the slopes of lines representing the min constraints become positive as. shown in FIG. 7D. Note that for non-comparable signals, the least upper-bound signal differs from either of the original signals. Thus, the bounding process requires the generation of new signals.

Now let us consider the general bounding problem involving more than two signals. Assume that there is a set of signals, $W=\{w_1, w_2, \ldots w_i\}$ at the same output pin of a gate. Let $r_m$ and $r_M$ be the sensitivity of the corresponding min and max constraints. The bounding problem is to find, for the late-mode worst-case timing, the least upper-bound signal which dominates all signals in W, and whereas, for the early-mode best-case timing, the greatest lower-bound signal which is dominated by all signals in W.

Figure 8:
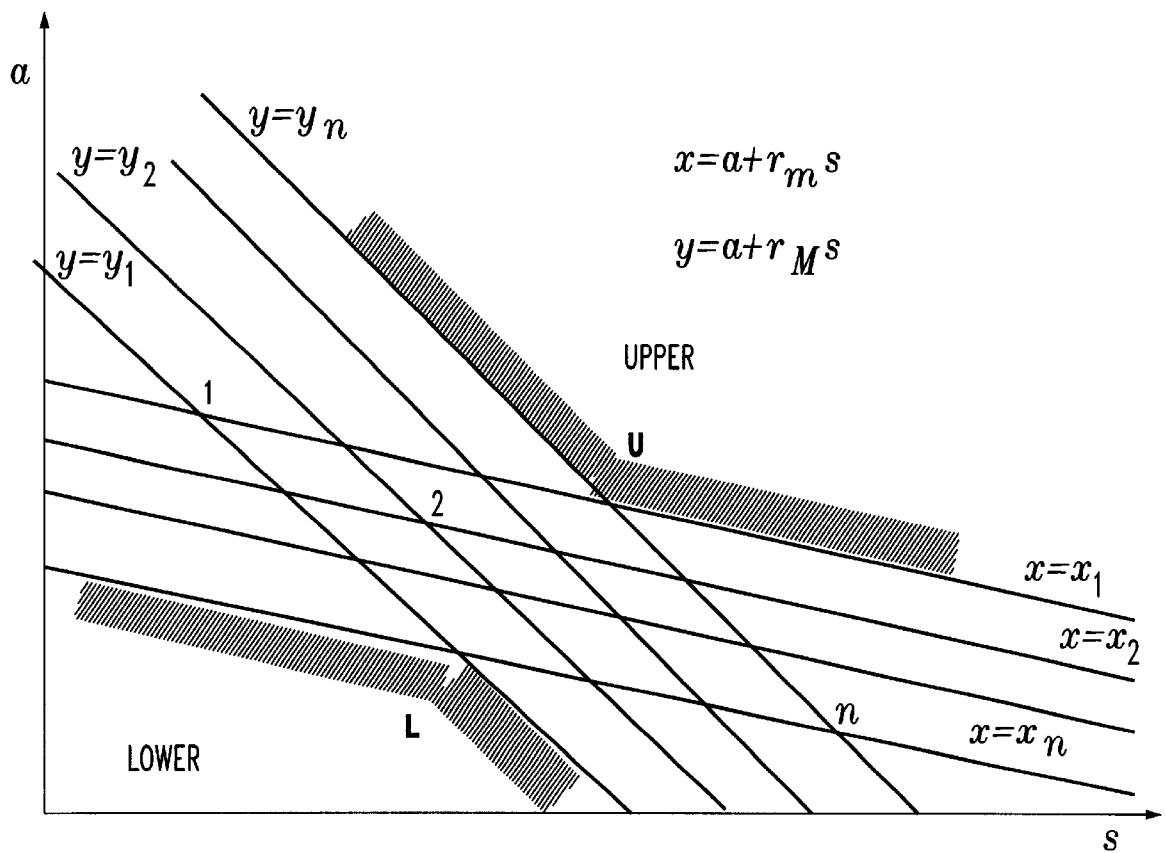
FIG. 8 is a diagram illustrating bounding regions for a set of signals according to slew dependent signal bounding techniques of the invention.

In FIG. 8, the lines are drawn to represent the min and max constraints for each signal, $w_1, w_2, \ldots w_i$. The lines for min constraints having the same slope are parallel to each other, and so are the lines for max constraints. The min and max path time of $w_i$ is $x_i=a_i+r_m*s_i$, and $y_i=a_i+r_M*s_i$. The min and max path time of an upper-bound signal $w=(s,a)$ must satisfy $x=a+r_m*s \geq x_i$ and $y=a+r_M*s \geq y_i$ for every i. Hence, $x \geq \max(x_1, x_2, \ldots x_n)$ and $y \geq \max(y_1, y_2, \ldots y_n)$. Let $U=(s_U, a_U)$ be the intersection point: $x_U=\max(x_1, x_2, \ldots x_n)$ and $y_U=\max(y_1, y_2, \ldots y_n)$. Then, $x_U \geq x_i$ and $y_U \geq y_i$. U dominates $w_i$ and is an upper-bound signal. On the other hand, any bounding signal satisfies $x \leq x_U$ and $y \geq y_U$. U is indeed the least upper-bound signal.

By similar analysis, the greatest lower-bound signal L can be derived for use in the early mode timing analysis, and thus we can state the following:

Proposition 1: For a set of signals, $W=\{w_1, w_2, \ldots w_n\}$, let $x_i=a_i+r_m*s_i$, and $y_i=a_i+r_M*s_i$. The least upper-bound signal $U=(s_U, a_U)$ is defined by $a_U+r_m*s_U=\max(x_1, x_2, \ldots x_n)$ and $a_U+r_M*s_U=\max(y_1, y_2, y_n)$, whereas the greatest lower bound signal $L=(s_L, a_L)$ is defined by $a_L+r_m*s_L=\min(x_1, x_2, \ldots x_n)$ and $a_L+r_M*s_L=\min(y_1, y_2, \ldots y_n)$.

(a) Computations for $r_m$ and $r_M$

Assume that signal, $w=(s, a)$, is present at the output pin of gate i. Consider a path p from this output pin to a latch n. Let j be a gate in the fan-out of gate i, and q be the sub-path from the output pin of j to n. Let the signal at the output pin of gate j and the input pin of latch n be $w_j=(s_j, a_j)$ and $w_n=(s_n, a_n)$. Then from the delay rules of gate j, we have $d_j=a_j-a=f_j(s)$ and $s_j=g_j(s)$. From the delay rules of path q, we have $d_q=a_n-a_j=f_q(s_j)$ and $s_n=g_q(s_j)$. The delay rules for path p can be defined by the following recursive formula:

$$g_p(s)=(g_q \circ g_j)(s)$$

$$f_p(s)=a_n-a=(f_j+f_q \circ g_j)(s) \quad (15)$$

where $\circ$ is the chaining operator: $f \circ g(s)=f(g(s))$. We then state the following:

Proposition 2: Assume that $D_M g \geq D_m g \geq 0$. We have the following bounds on the slew sensitivity for composite functions, $f+g$ and $f \circ g$:
(a) $D_M(f+g) \leq D_M f + D_M g$ and $D_m(f+g) \geq D_m f + D_m g$
(b) $D_M(f \circ g) \leq \max\{D_M f * D_M g, D_M f * D_m g\}$ and $D_m(f \circ g) \geq \min\{D_m f * D_m g, D_m f * D_M g\}$.

Proposition 2 may be proven in the following manner. The slew sensitivity of $f+g$ is $d(f+g)(s))/ds=f'(s)+g'(s)$ where ' is the differentiation operator. Since the maximum point of $f+g$ does not maximize $f$ and $g$ separately in general, we have $D_M(f+g) \leq D_M f + D_M g$. Similarly, the lower bound $D_m(f+g) \geq D_m f + D_m g$ can be proven. The slew sensitivity of $f \circ g$, can be obtained from the chain rules as $df(g(s))/ds=f'(g(s))*g'(s)$. Let $s_m$ and $s_M$ be the slew which minimizes and maximizes $g'(s)$: $D_m g=g'(s_m)$, $D_M g=g'(s_M)$. By definition, $D_m f \leq f'(g(s)) \leq D_M f$, and $0 \leq D_m g \leq g'(s) \leq D_M g$ since all $\beta$'s are assumed to be positive. Since $D_M f$ and $D_m f$ may be negative, $\min(D_m f * D_M g, D_m f * D_m g) \leq f'(g(s))*g'(s) \leq \max(D_M f * D_M g, D_M f * D_m g)$. If the sign of $D_M f$ is positive, $D_M f * D_M f$ is an upper bound to $D_M(f \circ g)$. Otherwise, $D_M f * D_m g$ is an upper bound.

Applying Proposition 2 to equation (15), we obtain $D_M f_p \leq \max\{\alpha_{Mj}+D_M f_q*\beta_{Mj}, \alpha_{Mj}+D_M f_q*\beta_{mj}\}$ where $\alpha_{mj}=D_m f_j$, $\alpha_{Mj}=D_M f_j$, $\beta_{Mj}=D_M g_j$, and $\beta_{mj}=D_m g_j$. Since the set of fan-out paths from gate i is the union of fan-out paths from all its immediate successor gates j, we have $$r_{Mi} = \max_p D_M f_p \leq \max_j \{\alpha_{Mj} + \max\{\max_q(D_M f_q) * \beta_{Mj}, \max_q(D_M f_q) * \beta_{mj}\}\}.$$

The same analysis applies to $r_{mi}$. We obtain the recursive relations:

$$r_{Mi} \leq \max_j \{\alpha_{Mj} + \max\{r_{Mj} * \beta_{Mj}, r_{Mj} * \beta_{mj}\}\} \quad (16)$$

$$r_{mi} \geq \min_j \{\alpha_{mj} + \min\{r_{mj} * \beta_{Mj}, r_{mj} * \beta_{mj}\}\} \quad (17)$$

This leads to the following algorithm to compute the slew sensitivity of constraints referred to herein as Algorithm trace_sensitivity:
(1) Sort the gate in the reverse order. That is, if there is a path from gate i to gate j, then place j before i.
(2) Initialize $r_{mi}$ and $r_{Mi}$ to 0 at latches. /*start the backward propagation through gates*/
(3) For each gate i, visit the set of successor gates {j} and compute $r_{Mi}$ and $r_{mi}$ as follows:
 (a) If $r_{Mj}$ is positive, set $r_{Mij} = \alpha_{Mj} + r_{Mj} * \beta_{Mj}$. Otherwise, set $r_{Mij} = \alpha_{Mj} + r_{Mj} * \beta_{mj}$.
 (b) If $r_{mj}$ is positive, set $r_{mij} = \alpha_{mj} + r_{mj} * \beta_{mj}$. Otherwise, set $r_{mij} = \alpha_{mj} + r_{mj} * \beta_{Mj}$.
 (c) Compute $r_{Mi}$ and as the maximum of $\{r_{Mij}\}$ and $r_{mi}$ as the minimum of $\{r_{mij}\}$.

Then we can start a forward propagation pass to compute the optimum arrival times using Proposition 1. The cost of this backward sweep algorithm is linear in the number of gates in the circuits.

We now deal with the case of positive α. For the case that α's are all positive, the slew sensitivities of constraints are also positive, and we have:

$$r_{Mi} \leq \max_j \{\alpha_{Mj} + r_{Mj} * \beta_{Mj}\} \text{ and } r_{mi} \geq \min_j \{\alpha_{mj} + r_{mj} * \beta_{mj}\} \quad (18)$$

Since $\beta_{Mk} \leq \beta_M$ and $\alpha_{Mk} \leq \alpha_M$ for all gates in the fan-out cone, $r_M$ for max constraint is bounded above by the series $$\sum_{k=1,N} \alpha_M * (\beta_M)^{k-1}, \text{ or:} \quad (19)$$

$$r_{Mi} \leq \alpha_M * (1 - \beta_M^N)/(1 - \beta_M)$$

where N is the maximum number of stages in the fan-out cone. Since the geometric series converges very fast, we can set N in equation (19) to infinity for computing the upper bound:

$$r_M \leq \alpha_M/(1-\beta_M) \quad (20)$$

Since $\beta_{mk} \geq \beta_m$ and $\alpha_{mk} \geq \alpha_m$ for all gates in the fan-out cone, $r_m$ for min constraint is bounded below by the series $$\sum_{k=1,n} \alpha_m * (\beta_m)^{k-1}, \text{ or:} \quad (21)$$

-continued
$$r_{mi} \geq \alpha_m * (1 - \beta_m^n)/(1 - \beta_m)$$

where n is the minimum number of stages in the fan-out cone. For signals at latches, n=0 and $r_m$=0. For signals on path with at least one gate, n>0 and:

$$r_m \geq \alpha_m \quad (22)$$

Figure 9:
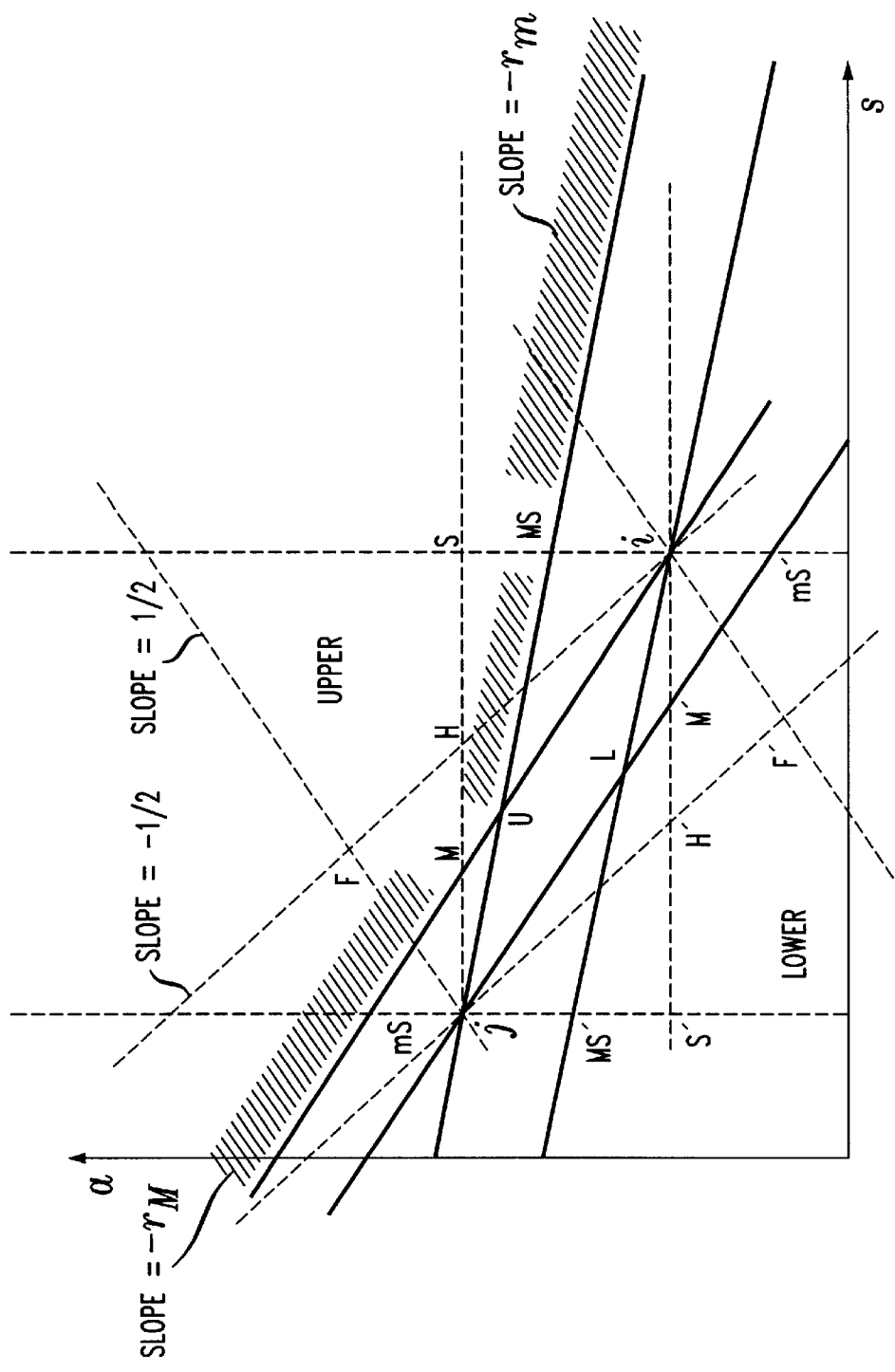
FIG. 9 is a diagram illustrating bounding signals in the s-a plane according to slew dependent signal bounding techniques of the invention.

For incomplete designs, in which the maximum (minimum) number of stages are unknown, equations (20) and (22) can be used for the max and min constraint.
(b) Methods Characterized by Two Slopes Referring to FIG. 9, bounding signals in s-a plane are shown. It is to be appreciated that in sections III(b), III(c), and IV to VI, we focus on bounding signal methods for the worst case late-mode analysis, and then, in section VII, we focus on bounding signal methods for the best case early-mode analysis. The shaded area in FIG. 9 shows the feasible quadrant for the upper bound of two non-comparable signals, $w_i$ and $w_j(s_i \geq s_j)$. For any point w=(s, a) in the s-a plane, we can draw two lines, one through $w_j$ and the other one through $w_i$. Let the slopes of these lines be −r1 and −r2. Then:

$$a+r1*s=u_j=a_j+r1*s_j \text{ and } a+r2*s=v_i=a_i+r2*s_i \quad (23)$$

On the other hand, given r1 and r2, we can solve equation (23) for a and s:

$$s=(v_i-u_j)/(r2-r1)=(a_i-a_j+r2*s_i-r*1s_j)/(r2-r1)$$

$$a=(r2*u_j-r1*v_i)/(r2-r1)=(-r1*a_i+r2*a_j-r1*r2*(s_i-s_j))/(r2-r1) \quad (24)$$

Given r1 and r2, equation (24) provides a formula for constructing a representative signal from two signals. Not all values are good for r1 and r2. If we want the signal to reside in the feasible quadrant within the slew range $[s_j, s_i]$, then the slopes have to satisfy the following bounds:

$$w \text{ (from equation (24))} \geq w_i, w_j, \text{ if } r2 \geq r_M \geq r_m \geq r1 \quad (25)$$

The construction methods with two slopes can be extended to the general case when there is a set of signals, W={$w_1, w_2, \ldots w_i$} present at the same gate output. First, a representative signal $w_{12}$ is constructed for a pair of signals, say the first two. Then, a representative signal $w_{123}$ for a triplet of signals is constructed with $w_{12}$ and a third signal. This process can be continued recursively, and leads to the following generalization of equation (23) for the representative signal (s,a):

$$a+r1*s=\max(u_1, u_2, \ldots u_n) \text{ and } a+r2*s=\max(v_1, v_2, \ldots v_n),$$

$$\text{where } u_k=a_k+r1*s_k, \text{ and } v_k=a_k+r2*s_k \text{ for } k=1, 2, \ldots n. \quad (26)$$

The following proposition can then be stated:
Proposition 3: In the general case with a set of signals W, if $r2 \geq r_M \geq r_m \geq r1$, then the signal point defined by equations (24) and (26) is inside the feasible quadrant formed by constraints $r_M$ and $r_m$.

This can be proven in the following manner. Let $w_i$ be the signal with maximum $a+r_m*s$ and $w_j$ be the signal with maximum $a+r_M*s$. From $w_i$ and $w_j$, we construct two signals: U=($s_U, a_U$) at the intersection of lines of slopes $-r_m$ and $-r_M$, and $w_k$=($s_k, a_k$) at the intersection of lines of slopes −r1 and −r2. According to equation (25), $w_k \geq U$ and thus satisfies the min and max constraint equations: $a_k+r_m*s_k \geq x_U$ and $a_k+r_M*s_k \geq y_U$ where $x_U+a_U+r_m*s_U$ and $y_U=a_U+r_M*s_U$.

With substitution from equation (24), the min constraint is transformed to $(r2*u_j-r1*v_i+r_m*(v_i-u_j))/(r2-r1) \geq x_U$, or equivalently $(r2-r_m)*u_j+(r_m-r1)*v_i \geq x_U*(r2-r1)$. Let $w=(s, a)$ be the signal constructed with equation (26). Since $u=a+r1*s \geq u_j$ and $v=a+r1*s \geq v_i$, we have $(r2-r_m)*u+(r_m-r1)*v \leq (r2-r_m)*u_j+(r_m-r1)*v_i \geq x_U*(r2-r1)$, and w also satisfies the min constraint. Similarly, it can be proven that w satisfies the max constraint. Therefore, w is inside the upper quadrant of U. According to Proposition 1, w is feasible.

Methods from Section II for positive α can all fit into this characterization scheme. The corresponding values for r1 and r2 are listed in Table 2 below. Point S (the maximum slew method) with $r1=0$ and $r2=\infty$ is definitely inside the feasible quadrant. The latest selection method picks the fast-rise later signal $w_j$, which is outside the feasible quadrant. H and F will fall in the feasible quadrant, if $r2=0.5 \geq r_M$. From equation (20), this translates into a sufficient condition: $1 \geq 2\alpha_M+\beta_M$, which is one of our assumptions, i.e., equation (8).

Four new points, M, MS, mS and U, are shown in Table 2. M has the same arrival time as S, but with slew less than both H and S. MS has the maximum slew and an arrival time earlier than S. mS has the minimum slew and an arrival time later than S. U is the optimal upper bound signal.

It can be proven that equations (24) and (26) can be reduced to equation (9) when appropriate r1 and r2 are substituted. For example, for the half envelope method ($r1=0$, $r2=0.5$), $x_i=a_i$, $y_i=a_i+0.5*s_i=t_i$, and the signal with maximum $a_i$ and maximum $t_i$ is selected.

It is to be appreciated that with respect to methods in Table 2: If $r_m$ becomes negative due to negative α's, then points M, H, and S become infeasible, and this leaves U, F, MS and mS as the only valid methods for worst-case timing analysis.

TABLE 2

| Methods | r1 | r2 |
|---|---|---|
| j: Latest arriving | 0 | $(\alpha_i-\alpha_j)/(s_i/s_j)$ |
| S: Max slew | 0 | ∞ |
| H: Half envelope | 0 | 0.5 |
| F: Full envelope | −0.5 | 0.5 |
| M: Modified half envelope | 0 | $r_M$ |
| MS: Modified max slew | $r_m$ | ∞ |
| mS: Modified min slew | −∞ | $r_M$ |
| U: Least upper bound | $r_m$ | $r_M$ |

(c) Monotonicity

Monotonic delay is often a desired property which can be used to speed up the circuit timing and tuning process. According to the invention, we present the following definition for monotonicity:

For a set of signals, $W=\{w_1, w_2, \ldots w_n\}$, let $w_i$ be the one with maximum $a+r1*s$ and $w_j$ be the one with maximum $a+r2*s$. Then s and a of the representative signal from equations (24) and (26) are functions of four variables $a_i$, $a_j$, $s_i$, $s_j$, and so are the min and max path times: $x=a+r_m*s$ and $y=a+r_M*s$. Since the arrival times at latches are monotonic increasing functions of the min and max path times, we shall say the representative signal construction method preserves the monotonic property, if x and y are monotonic increasing with all four variables $a_i$, $a_j$, $s_i$, $s_j$.

Therefore, to satisfy the monotonic property, the partial derivatives of min and max path times with respect to $a_i$, $a_j$, $s_i$, $s_j$, need to be either zero or positive. In other words, the 4-dimensional gradient vectors $\nabla x=(\partial x/\partial a_i, \partial x/\partial a_j, \partial x/\partial s_i, \partial x/\partial s_j)$ and $\nabla y=(\partial y/\partial a_i, \partial y/\partial a_j, \partial y/\partial s_i, \partial y/\partial s_j)$ must not contain any negative derivative. From equation (24), we have $\nabla s=(1, -1, r2, -r1)/(r2-r1)$ and $\nabla a=(-r1, r2, -r1*r2, r1*r2)/(r2-r1)$ for the case of constant r1 and r2. This leads to:

$$\nabla x=(r_m-r1, r2-r_m, r2*(r_m-r1), r1*(r2-r_m))/(r2-r1)$$

$$\nabla y=(r_M r1, r2-r_M, r2*(r_M-r1), r1*(r2-r_M))/(r2-r1) \quad (27)$$

Under the assumptions that $r2 \geq r_M \geq r_m \geq r1$, the derivatives of x and y with respect to $a_i$, $a_j$ are never negative, while the sign of derivatives with respect to $s_i(s_j)$ are the same as that of r2(r1). If $r1>0$, then there are no negative derivatives. Thus we have proven the following proposition:

Proposition 4: The method using two constant slopes r1 and r2, such that $r2 \geq r_M \geq r_m \geq r1 \geq 0$, preserves the monotonic property.

The latest arriving method is not monotonic as described in the background section. Because of negative r1, points F and mS are also not monotonic. For the case that $r_m \geq 0$, points S, H, M, MS and U preserves the monotonic property. For the case that $r_M \geq 0$ and $r_m \leq 0$, points S, H and M preserve the monotonic property but are not feasible, while points U, F, mS and MS do not preserve the monotonic property but are feasible. For the case that $r_M \leq 0$ and $r_m \leq 0$, only the infeasible point S preserves the monotonic property.

Figure 10:
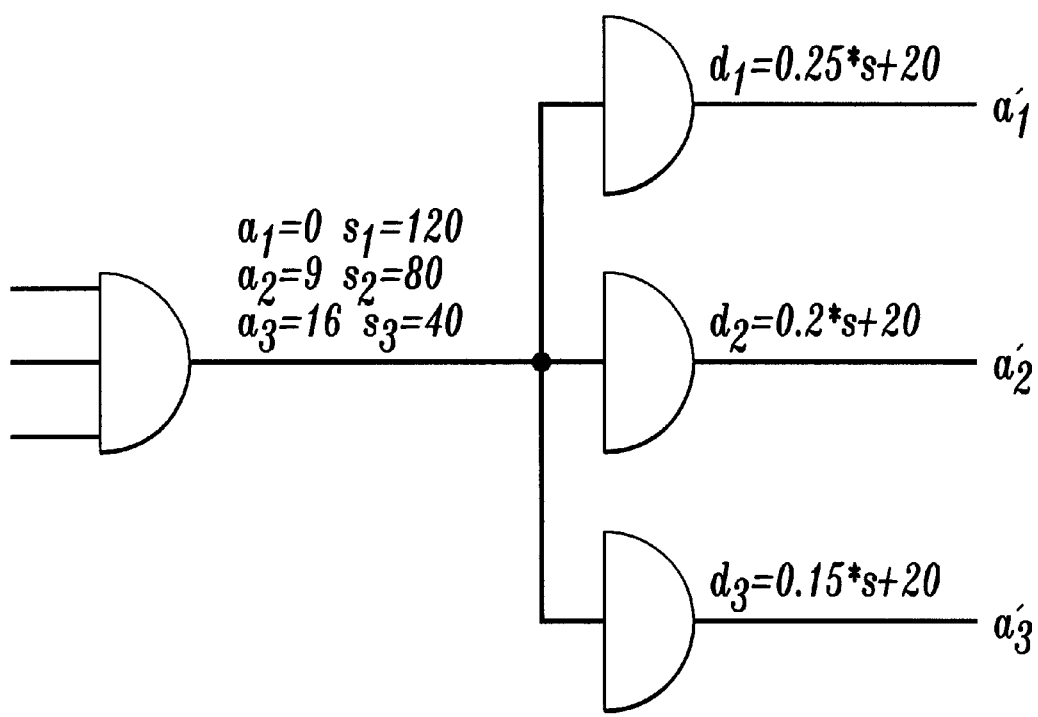
FIG. 10 is a diagram illustrating an exemplary implementation of a multiple signal bounding technique according to the invention.

IV. Multiple Signal Technique

Where further accuracy is required, the present invention provides a multiple signal approach. The multiple signal approach is described in the context of FIG. 10. For example, in FIG. 10, three fan-out gates have different slew-dependent rules, $d_1$, $d_2$, $d_3$. The arrival times at these outputs, $a'_1$, $a'_2$, $a'_3$, for three signals $w_1$, $w_2$, $W_3$, are listed in the first three columns of Table 3 below. At output $a'_1$, $w_1$ produces the latest signal. At output $a'_2$, $w_2$ produces the latest signal. At output $a'_3$, $w_3$ produces the latest signal. No single signal can be chosen to generate the latest signals at all outputs. The arrival time from several bound methods are also listed in Table 3. No bound method gives the correct latest arrival time for all three outputs. The least upper bound method U predicts the correct $a'_1$ and $a'_3$, but the wrong $a'_2$. Therefore, to compute the true latest arrival times at all latches, we need to store and propagate a set of signals, which contain the combinations of all possible slew and arrival times.

TABLE 3

| | $w_1 =$ $(s_1, a_1)$ | $w_2 =$ $(s_2, a_2)$ | $w_3 =$ $(s_3, a_3)$ | U | M | H | F | S | mS | MS |
|---|---|---|---|---|---|---|---|---|---|---|
| $a'_1$ | 50 | 49 | 46 | 50 | 50 | 58 | 64 | 66 | 50 | 54 |
| $a'_2$ | 44 | 45 | 44 | 46 | 47.2 | 53.6 | 60.8 | 60 | 48 | 48 |
| $a'_3$ | 38 | 41 | 42 | 42 | 44.4 | 49.2 | 49.2 | 54 | 46 | 42 |

However, the signal set may grow very large in size, as it propagates through a large circuit network. Advantageously, we can use the dominance relation ≧ to trim out those signals, which are dominated by other signals. In other words, we need to consider only maximal signals. A maximal signal is defined as one which no other signal dominates, and a maximal signal set is defined as the subset consisting of maximal signals. Since the dominance order of signals will not change during the propagation through the circuit, the worst-case timing can be computed using waveforms represented by the maximal signal set. The maximal signal set can be obtained by a simple sorting, according to Proposition 5 below. An example of sorted maximal signal set is shown in FIG. 8.

Proposition 5: For a maximal signal set, $W=\{w_1, w_2, \ldots w_n\}$, let $x_i=a_i+r_m*s_i$ and $y_i=a_i+r_M*s_i$. Then:
(1) All $x_i$'s and $y_i$'s are distinct.
(2) If $\{x_i\}$ is sorted in a strictly descending sequence, then $\{y_i\}$ will be sorted simultaneously in a strictly ascending sequence.

This may be proven in the following manner. For the first part, let us assume that $x_i=x_j$. If $y_i>y_j$, then $w_j$ is not maximal. If $y_i<y_j$, then $w_i$ is not maximal. Both lead to contradiction. So $x_i\neq x_j$. In a similar way, we can prove that all $y_i$'s are distinct. For the second part, we observed that if $x_i>x_j$ and $y_i>y_j$, then $w_i>w_j$. Therefore, $x_i$'s and $y_i$'s are in the opposite order.

The trimming mechanism by the maximal set is very powerful as is illustrated in the experiment discussed in Section VI. According to the principle of causality, one of two non-overlapping signals will dominate the other. So the maximal signal set will contain only overlapping signals. If r's and the maximal set are not available, we can use the set of overlapping signals instead in the signal propagation.

V. Static Timer Implementation

Figure 11:
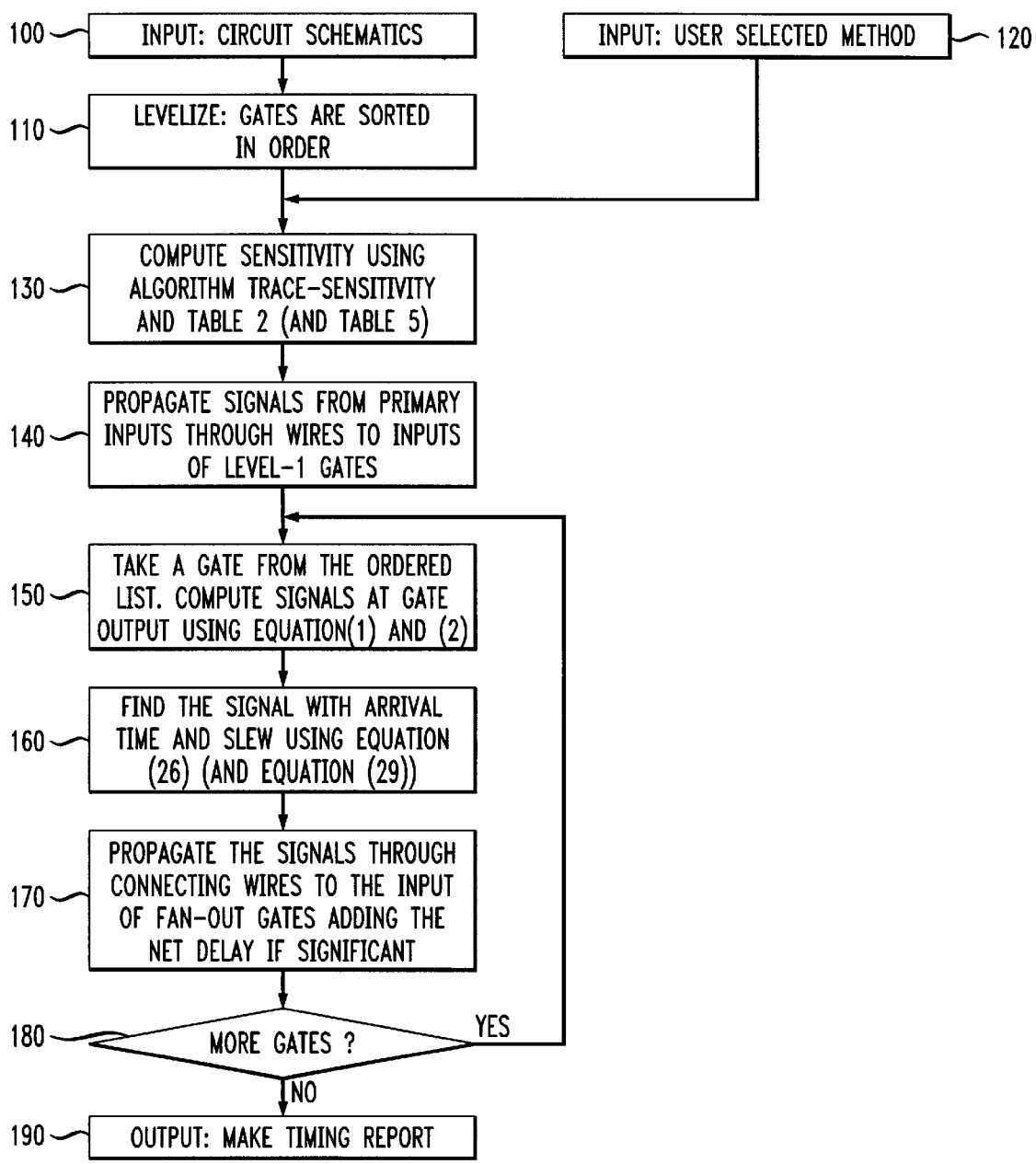
FIG. 11 is a flow diagram illustrating a static timer implementation of a signal bounding computation process according to the invention.

Referring now to FIG. 11, a flow diagram of a static timer implementation of a signal bounding computation process according to the invention is shown. An exemplary hardware implementation of a static timer employing bounding signal computation according to the invention will be given in the context of FIG. 12.

First, in step 100 of FIG. 11, the circuit schematics of the VLSI chip on which static timing analysis is to be performed are input to the static timer. The schematics include the gates, latches and paths associated with the circuit and may be input in any conventional manner. In step 110, the gates of the circuit are levelized. That is, the gates are sorted in order and assigned levels. Next, in step 120, a user selects the method that is preferred for the particular input circuit, e.g., a method from Table 2 above. The user's method selection is preferably entered at the same time the circuit schematic is specified. Given the user's selection, the slew sensitivity of the maximum and minimum constraints is computed in accordance with the Algorithm trace_sensitivity above and Table 2.

In step 140, signals are propagated from primary inputs through wires to inputs of level-1 gates. A gate is then taken from the ordered list, in step 150. Signals representing the arrival time and slew are computed at the gate output according to equations (1) and (2) above. Then, in step 160, the representative signal (s, a) is computed with the arrival time and slew according to equation (26) above. The signals computed in steps 150 and 160 are then propagated through connecting wires to the input pins of fan-out gates, in step 170, adding the net delay if significant.

In step 180, it is determined if there are any more gates in the circuit. If there are more gates, steps 150 through 170 are iteratively repeated for each gate. If all gates in the input schematic have been processed, then a timing report representing the results of the static timing analysis is output to the user in step 190.

Figure 12:
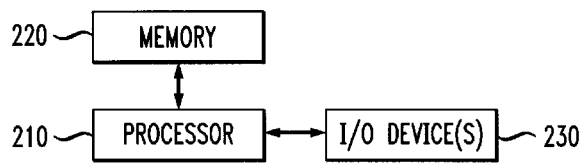
FIG. 12 is a block diagram illustrating a hardware implementation of static timer apparatus for a signal bounding computation process according to the invention.

Referring now to FIG. 12, an exemplary hardware implementation of static timer apparatus employing bounding signal computation according to the invention is shown. In this implementation, a static timer system includes a processor 210, memory 220 and I/O devices 230. Processor 210 performs the steps of the methodologies of the invention described herein, e.g., the illustrative bounding signal computation described in FIG. 11. The processor 210 employs memory 220 in performing such operations, e.g., storing user input selections and circuit schematics, etc. Memory 220 may also store software code for implementing the methodologies for execution by the processor 210. I/O devices 230 may include a keyboard, mouse, etc., for allowing a user to input data for use by the invention and a display, printer, etc.; for presenting a user with results associated with the processor operations, e.g., timing report, etc.

Figure 13:
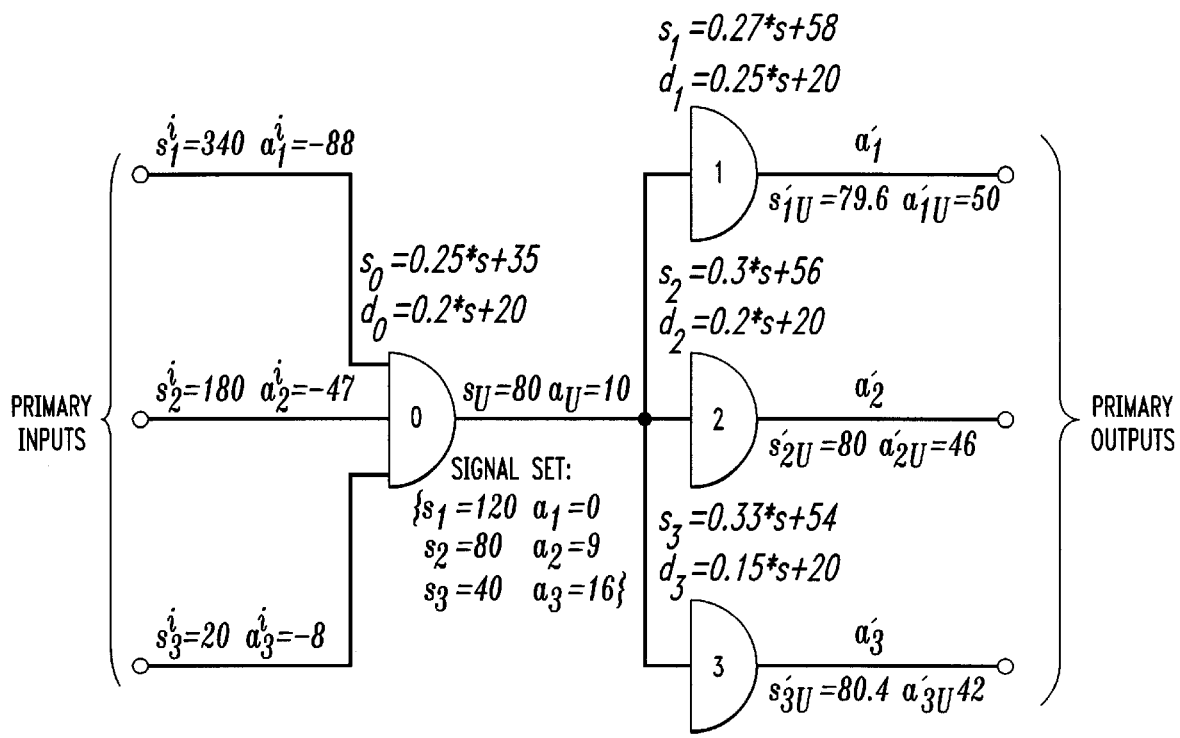
FIG. 13 is a diagram illustrating a timing analysis flow using a least upper bound signal process according to the invention.

Referring now to FIG. 13, a diagram is shown illustrating a timing analysis flow using a least upper bound signal process according to the invention. The example follows the steps of the illustrative process of FIG. 11. It is to be appreciated that subscript U will be used in this example to denote the arrival time and slew computed with the least upper bound method. For simplicity, wire delay is assumed to be zero in this example.

First, the user specifies the schematic of FIG. 13 as the circuit schematic and the least upper bound method as the desired method (steps 100 and 120). The schematic includes gates 0, 1, 2 and 3. The gates are sorted in the following order: 0, 1, 2, 3 (step 110). Gate 0 is at level 1, while gates 1, 2 and 3 are at level 2. Then, following the reverse order of gates, the Algorithm trace_sensitivity is performed to compute $r_m$ and $r_M$ for each gate (step 130). So, in this example, gates 1, 2 and 3 have $r_m=0$ and $r_M=0$, and gate 0 has $r_m=0.15$ and $r_M=0.25$. Then, we set r1 to $r_m$ and r2 to $r_M$ according to Table 2, since the least upper bound is the method the user selected.

Next the signals denoted by $s_1^i, a_1^i$, and $s_2^i, a_2^i$, and $s_3^i, a_3^i$ are propagated from primary inputs to the inputs of gate 0 (step 140). The corresponding three signals $(s_1, a_1), (s_2, a_2), (s_3, a_3)$ are then computed at the output of gate 0 (step 150). From these three signals, the bounding signal is computed (step 160) by solving equation (26) to yield $(s_U=80, a_U=10)$. The bounding signal $(s_U, a_U)$ is then propagated to the inputs of gates 1, 2 and 3 (step 170). The signals are propagated through gate 1 in the same way (step 180). Since only one signal $(s_U, a_U)$ remains at the input of gate 1, it is the one to propagate to the next stage, which in this example is a primary output. The signals are also propagated through gates 2 and 3 in the same way (step 180). Lastly, the bounding signals are reported at the primary outputs (step 190).

VI. Experimental Results

To assess the accuracy of these different methods, the following experiments are performed on ISCAS benchmark circuits. Linear delay rules are used: gate delay=100 ps+0.25*(Tx−200 ps)+100 ps*(gain−1), and gate output slew=200 ps+0.4*(Tx−200 ps)+200 ps*(gain−1), where Tx is the input slew and gain is the ratio of capacitance load over the input capacitance. For simplicity, we assume that all gates have the same size, and the gain is equal to the number of fan-outs. Sharp signals with zero slew are fed into primary inputs and latches at time 0. Because of the slew-dependent delay rule, the signal slew will gradually increase and spread into a range between 0 and some maximum slew value after propagating through gates.

Six timing runs are done: the exact multiple signal method (E), the latest arriving method (late), the max slew method (S), the full envelope method (F), the half envelope method (H), and the upper bound method (U). Table 4 lists the maximum difference of worst-case delay at primary outputs between the last five methods and the exact method. The latest arriving method gives too optimistic timing in the case of circuit c432. The maximum slew method is the most pessimistic method among the five. The full envelope method sometimes yields modest error. The half envelope method performs better than the full envelope method, while the upper.bound method produces the best result among the five. In this experiment, the number of signals in the maximal signal set never exceeds 10, because of the trimming. Hence, the exact method with multiple signals is also be a viable solution. In the real circuit with different gate sizes and the range of slew larger, we may encounter situations that the slew has a larger effect on the timing.

TABLE 4

| Ckt | Latest arriving late - E | max slew S - E | Full envelope F - E | Half envelope H - E | Upper bound U - E |
|---|---|---|---|---|---|
| C17 | 0 | 0 | 0 | 0 | 0 |
| C432 | −61 | 60 | 35 | 18 | 6 |
| C499 | 0 | 0 | 0 | 0 | 0 |
| C880 | 0 | 40 | 8 | 7 | 0 |
| C1355 | 0 | 0 | 0 | 0 | 0 |
| C1908 | 0 | 0 | 0 | 0 | 0 |
| C2670 | 0 | 20 | 8 | 3 | 0 |
| C3540 | 0 | 0 | 0 | 0 | 0 |
| C5315 | 0 | 132 | 0 | 0 | 0 |
| C6288 | 0 | 20 | 4 | 4 | 0 |
| C7552 | 0 | 2692 | 402 | 365 | 0 |

VII. Early-mode Signals

The best case early-mode signals may be obtained in a similar fashion to the late-mode signal. Let us consider the example in FIG. 9 of two non-comparable signals, $w_i$ and $w_j (s_i \geq s_j)$. For any point $w=(s, a)$ in the feasible region for the early signals, i.e., the lower quadrant of the s-a plane, we can draw two lines, one through $w_i$ and the other one through $w_j$. Let the slope of the line drawn between $w_i$ and w be $-r1$; and the slope of the line drawn between $w_j$ and w be $-r2$. Then, the signal w is given by:

$$a+r1*s=u_i=a_i+r1*s_i \text{ and } a+r2*s=v_j=a_j+r2*s_j \quad (28)$$

In the general case when there is a set of signals, $W=\{w_1, w_2, \ldots w_i\}$ present at the same gate output, a similar argument used for the late-mode signals can be applied here. From equation (26), we obtain the following corresponding equation for the representative early-mode signal:

$$a+r1*s=\min(u_1, u_2, \ldots u_n) \text{ and } a+r2*s=\min(v_1, v_2, \ldots v_n),$$

where $u_k a_k + r1*s_k$, and $v_k=a_k+r2*s_k$ for $k=1, 2, \ldots n$. (29)

The corresponding methods for early-mode signals are i for the traditional early arriving method, S' for the minimum slew method, H' for the half envelope method, F' for the full envelope method, M' for the modified half envelope method, MS' for the modified minimum slew method, mS' for the modified maximum slew method, and L for the greatest lower bound method. These early signals are marked in FIG. 9 and the corresponding slopes, r1 and r2 are listed in Table 5 below.

TABLE 5

| Methods | r1 | r2 |
|---|---|---|
| i: Earliest arriving | 0 | $(\alpha_i-\alpha_j)/(s_i-s_j)$ |
| S': Min slew | 0 | ∞ |
| H': Half envelope | 0 | 0.5 |
| F': Full envelope | −0.5 | 0.5 |
| M': Modified half envelope | 0 | $r_M$ |
| MS': Modified min slew | $r_m$ | ∞ |
| mS': Modified max slew | −∞ | $r_M$ |
| L: Greatest lower bound | $r_m$ | $r_M$ |

It is to be appreciated that a static timer implementation such as is illustrated in FIG. 11 may also include early-mode analysis in accordance with Table 5 and equation (29). As such, the steps of the method shown in FIG. 11 in which early-mode analysis is added parenthetically indicate the early-mode analysis portion, i.e., steps 130 and 160.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for use in signal timing analysis with respect to a circuit having at least one gate, the method comprising the steps of:

determining a first constraint slew sensitivity value (r1) and a second constraint slew sensitivity value (r2) for the gate according to a specified bounding technique; and computing a representative signal for the gate in accordance with the first and second values including an arrival time and slew rate, wherein the representative signal bounds signal paths by bounding a maximum slew sensitivity path and a minimum slew sensitivity path.

2. The method of claim 1, wherein the bounding technique is a half envelope technique wherein r1 is about zero and r2 is about 0.5.

3. The method of claim 1, wherein the bounding technique is a full envelope technique wherein r1 is about −0.5 and r2 is about 0.5.

4. The method of claim 1, wherein the bounding technique is a modified half envelope technique wherein r1 is about zero and r2 is a maximum constraint slew sensitivity value.

5. The method of claim 1, wherein the computed signal is representative of a worst case arrival time and slew rate.

6. The method of claim 5, wherein the bounding technique is a maximum slew technique wherein r1 is about zero and r2 is substantially infinite.

7. The method of claim 5, wherein the bounding technique is a modified maximum slew technique wherein r1 is a minimum constraint slew sensitivity value and r2 is substantially infinite.

8. The method of claim 5, wherein the bounding technique is a modified minimum slew technique wherein r1 is substantially negatively infinite and r2 is a maximum constraint slew sensitivity value.

9. The method of claim 5, wherein the bounding technique is a least upper bound technique wherein r1 is a minimum constraint slew sensitivity value and r2 is a maximum constraint slew sensitivity value.

10. The method of claim 1, wherein the computed signal is representative of a best case arrival time and slew rate.

11. The method of claim 10, wherein the bounding technique is a minimum slew technique wherein r1 is about zero and r2 is substantially infinite.

12. The method of claim 10, wherein the bounding technique is a modified minimum slew technique wherein r1 is a minimum constraint slew sensitivity value and r2 is substantially infinite.

13. The method of claim 10, wherein the bounding technique is a modified maximum slew technique wherein r1 is substantially negatively infinite and r2 is a maximum constraint slew sensitivity value.

14. The method of claim 10, wherein the bounding technique is a greatest lower bound technique wherein r1 is a minimum constraint slew sensitivity value and r2 is a maximum constraint slew sensitivity value.

15. The method of claim 1, wherein the circuit includes a plurality of gates.

16. The method of claim 15, further including the step of assigning levels to the plurality of gates prior to determining the first constraint slew sensitivity and second constraint slew sensitivity values for each of the plurality of gates.

17. The method of claim 16, further including the step of propagating signals from inputs of the circuit to an input of the first gate at the first level, each signal representing an arrival time and slew rate.

18. The method of claim 17, further including the step of computing signals at an output of the first gate at the first level, the signals corresponding to respective gates at a next level to which the first gate at the first level is connected, and each signal representing an arrival time and slew rate.

19. The method of claim 18, wherein the representative bounding signal is computed from the signals computed at the output of the first gate at the first level.

20. The method of claim 19, wherein a representative bounding signal is computed for each gate at each level.

21. The method of claim 20, wherein the representative bounding signals for each gate are presented to a user in a timing report.

22. Apparatus for use in signal timing analysis with respect to a circuit having at least one gate, the apparatus comprising:

at least one processor operative to determine a first constraint slew sensitivity value and a second constraint slew sensitivity value for the at least one gate according to a specified bounding technique, and to compute a representative signal for the gate in accordance with the first and second values including an arrival time and slew rate, wherein the representative signal bounds signal paths by bounding a maximum slew sensitivity path and a minimum slew sensitivity path; and memory coupled to the at least one processor which stores one or more of the computed values or signals.

23. The apparatus of claim 22, wherein the bounding technique is a half envelope technique wherein r1 is about zero and r2 is about 0.5.

24. The apparatus of claim 22, wherein the bounding technique is a full envelope technique wherein r1 is about −0.5 and r2 is about 0.5.

25. The apparatus of claim 22, wherein the bounding technique is a modified half envelope technique wherein r1 is about zero and r2 is a maximum constraint slew sensitivity value.

26. The apparatus of claim 22, wherein the computed signal is representative of a worst case arrival time and slew rate.

27. The apparatus of claim 26, wherein the bounding technique is a maximum slew technique wherein r1 is about zero and r2 is substantially infinite.

28. The apparatus of claim 26, wherein the bounding technique is a modified maximum slew technique wherein r1 is a minimum constraint slew sensitivity value and r2 is substantially infinite.

29. The apparatus of claim 26, wherein the bounding technique is a modified minimum slew technique wherein r1 is substantially negatively infinite and r2 is a maximum constraint slew sensitivity value.

30. The apparatus of claim 26, wherein the bounding technique is a least upper bound technique wherein r1 is a minimum constraint slew sensitivity value and r2 is a maximum constraint slew sensitivity value.

31. The apparatus of claim 22, wherein the computed signal is representative of a best case arrival time and slew rate.

32. The apparatus of claim 31, wherein the bounding technique is a minimum slew technique wherein r1 is about zero and r2 is substantially infinite.

33. The apparatus of claim 31, wherein the bounding technique is a modified minimum slew technique wherein r1 is a minimum constraint slew sensitivity value and r2 is substantially infinite.

34. The apparatus of claim 31, wherein the bounding technique is a modified maximum slew technique wherein r1 is substantially negatively infinite and r2 is a maximum constraint slew sensitivity value.

35. The apparatus of claim 31, wherein the bounding technique is a greatest lower bound technique wherein r1 is a minimum constraint slew sensitivity value and r2 is a maximum constraint slew sensitivity value.

36. The apparatus of claim 22, wherein the circuit includes a plurality of gates.

37. The apparatus of claim 36, wherein the processor is further operative to assign levels to the plurality of gates prior to determining the first constraint slew sensitivity and second constraint slew sensitivity values for each of the plurality of gates.

38. The apparatus of claim 37, wherein the processor is further operative to propagate signals from inputs of the circuit to an input of the first gate at the first level, each signal representing an arrival time and slew rate.

39. The apparatus of claim 38, wherein the processor is further operative to compute signals at an output of the first gate at the first level, the signals corresponding to respective gates at a next level to which the first gate at the first level is connected, and each signal representing an arrival time and slew rate.

40. The apparatus of claim 39, wherein the representative bounding signal is computed from the signals computed at the output of the first gate at the first level.

41. The apparatus of claim 40, wherein a representative bounding signal is computed for each gate at each level.

42. The apparatus of claim 41, wherein the representative bounding signals for each gate are presented to a user in a timing report.

43. An article of manufacture for use in signal timing analysis with respect to a circuit having at least one gate, comprising a machine readable medium containing one or more programs which when executed implement the steps of:

determining a first constraint slew sensitivity value (r1) and a second constraint slew sensitivity value (r2) for the gate according to a specified bounding technique; and computing a representative signal for the gate in accordance with the first and second values including an arrival time and slew rate, wherein the representative signal bounds signal paths by bounding a maximum slew sensitivity path and a minimum slew sensitivity path.

* * * * *